United States Patent
Cheng et al.

(10) Patent No.: US 9,023,726 B1
(45) Date of Patent: May 5, 2015

(54) METHOD OF FABRICATING SEMICONDUCTOR DEVICE

(71) Applicant: United Microelectronics Corp., Hsin-Chu (TW)

(72) Inventors: Wei Cheng, Singapore (SG); Ming Sheng Xu, Singapore (SG); Duan Quan Liao, Singapore (SG); Yikun Chen, Singapore (SG); Ching Hwa Tey, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/082,200

(22) Filed: Nov. 18, 2013

(51) Int. Cl.
*H01L 21/3205* (2006.01)
*H01L 21/28* (2006.01)
*H01L 21/8234* (2006.01)

(52) U.S. Cl.
CPC .. *H01L 21/28132* (2013.01); *H01L 21/823468* (2013.01)

(58) Field of Classification Search
USPC ......... 438/596, 595, 184, 230, 267, 303, 304, 438/446
See application file for complete search history.

(56) References Cited

U.S. PATENT DOCUMENTS

| | | | |
|---|---|---|---|
| 4,851,365 A | 7/1989 | Jeuch | |
| 6,803,276 B2 | 10/2004 | Kim | |
| 6,821,849 B2 | 11/2004 | Chang | |
| 7,518,912 B2 | 4/2009 | Hung | |
| 2009/0061581 A1* | 3/2009 | Tsai et al. | 438/257 |
| 2009/0186459 A1 | 7/2009 | Chen | |

* cited by examiner

*Primary Examiner* — Timor Karimy
(74) *Attorney, Agent, or Firm* — Winston Hsu; Scott Margo

(57) ABSTRACT

A method of fabricating a semiconductor device includes the following steps. At least a first gate stack layer and at least a second gate stack layer protruding from a conductive layer on a substrate are provided. Subsequently, two spacers and a protective layer are formed on the conductive layer, and the two spacers and the protective layer jointly surround the protruded first gate stack layer and the protruded second gate stack layer. The two spacers and the protective layer are used as a mask to remove a part of the conductive layer. Afterwards, the two spacers and the protective layer are removed.

20 Claims, 12 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more particularly, to a method of fabricating a semiconductor device having a select gate disposed at a side of agate stack layer, where the select gate defined by a spacer has a planar top surface.

2. Description of the Prior Art

A flash memory is a non-volatile memory, which can preserve data within the memory even when an external power supply is turned off. Because a flash memory is re-writable and re-erasable, in recent years it has been widely applied in the fabrication of electrical products, such as mobile phones, digital cameras, video players, personal digital assistants (PDA) or systems on a chip (SOC).

Please refer to FIG. 1, which is a cross sectional diagram illustrating a conventional flash memory cell. As shown in FIG. 1, the flash memory cell 10 includes a semiconductor substrate 12, a gate stack layer 14 disposed on the semiconductor substrate 12, and a select gate 20 disposed at a side of the gate stack layer 14. The gate stack layer 14 includes a floating gate 16 and a control gate 18. The floating gate 16, the control gate 18 and the select gate 20 are commonly made of polysilicon, and the dielectric layers 22/24/26 such as oxide layers are disposed between the gates for electric insulation. The flash memory cell 10 further includes a source region 28 and a drain region 30 disposed in the semiconductor substrate 12 at two sides of the gate stack layer 14. Furthermore, the dielectric layers 22 between the floating gate 16 and the semiconductor substrate 12 may serve as a tunneling oxide, and the hot electrons through the dielectric layers 22 move in or out of the floating gate 16 to enable data accessing.

In the manufacturing process of the conventional flash memory cell 10, the method of forming the select gate 20 may include the following steps. A polysilicon layer (not shown) is conformally deposited on the semiconductor substrate 12, and a blanket etching process is performed to remove a part of the polysilicon layer while the gate stack layer 14 serves as a stop layer. Therefore, the two spacer-shaped select gates can be formed at two sides of the gate stack layer 14. Subsequently, a mask is used to cover one side of the gate stack layer 14, such as the select gate 20 above the drain region 30, and a reactive-ion-etching (RIE) process is performed to remove the select gate at the other side of the gate stack layer 14, such as the select gate (not shown) above the source region 28, to complete the formation of structure of the flash memory cell 10. However, the non-planar top surface of the spacer-shaped select gate 20 may cause unstable landing of a later formed contact plug which is used to connect the select gate 20 and increase the resistance of the flash memory cell 10.

Accordingly, how to provide a select gate having a planar top surface in order to improve the performances of the flash memory cell is still an important issue in the field.

SUMMARY OF THE INVENTION

An objective of the present invention is therefore to provide a method of fabricating a semiconductor device including forming a select gate having a planar top surface, where the select gate is defined by a spacer which serves as a mask.

According to one exemplary embodiment of the present invention, a method of fabricating a semiconductor device includes the following steps. At least a first gate stack layer protruding from a conductive layer on a substrate is provided. A first spacer is formed on the conductive layer at a side of the first gate stack layer. The first spacer is used as a mask to remove a part of the conductive layer to form a select gate having a planar top surface.

According to another exemplary embodiment of the present invention, a method of fabricating a semiconductor device includes the following steps. At least a first gate stack layer and at least a second gate stack layer protruding from a conductive layer on a substrate are provided. Subsequently, two spacers and a protective layer are formed on the conductive layer, and the two spacers and the protective layer jointly surround the protruded first gate stack layer and the protruded second gate stack layer. The two spacers and the protective layer are used as a mask to remove a part of the conductive layer. Afterwards, the two spacers and the protective layer are removed.

The present invention provides at least a spacer formed on a conductive layer at a side of at least a gate stack layer protruding from the conductive layer, where the spacer can further serve as a mask to remove a part of the conductive layer to form a select gate having a planar top surface, in which a bottom width of the spacer corresponds to a predetermined top width of the formed select gate. The spacer can be self-aligned and directly used as a mask to define the location of the select gate. Consequently, some extra photolithography processes can be omitted to thereby simplify the manufacturing process, and the mask shift issue can be avoided which improves the consistency of the formed select gates.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
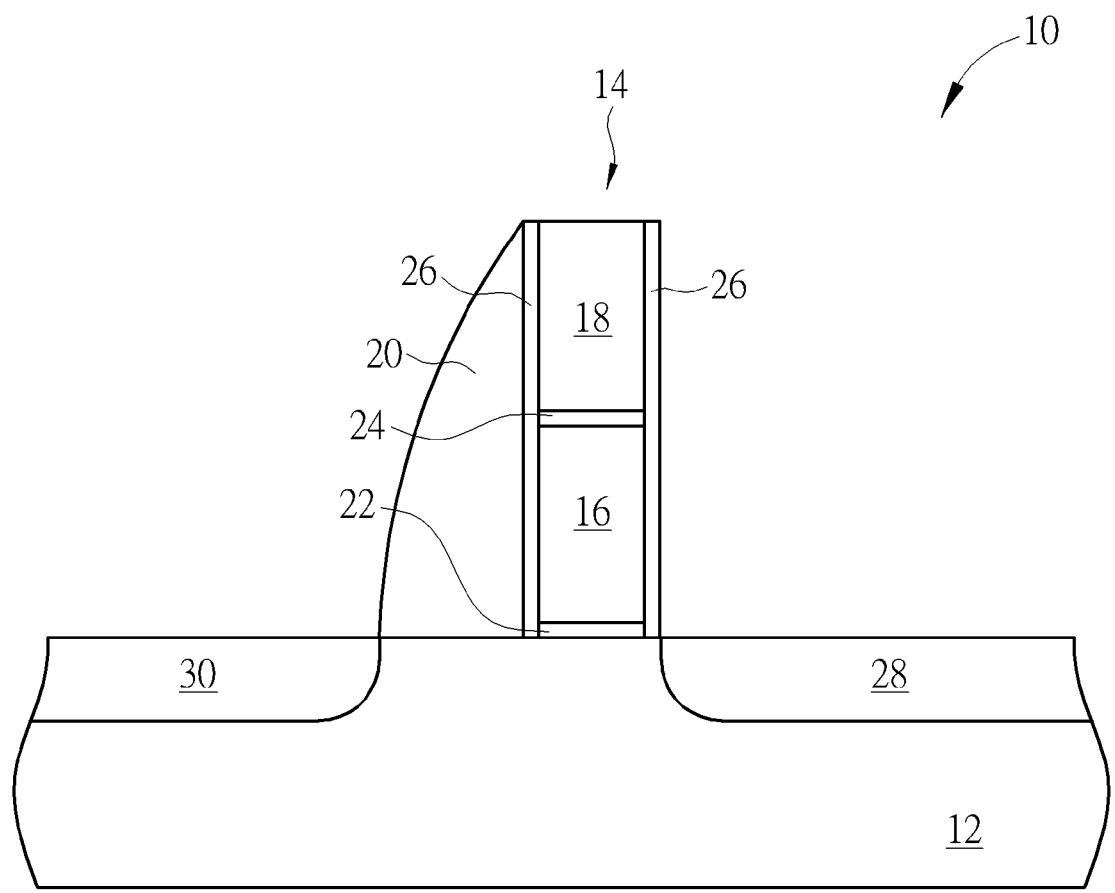
FIG. 1 is a cross sectional diagram illustrating a conventional flash memory cell.
Figure 2:
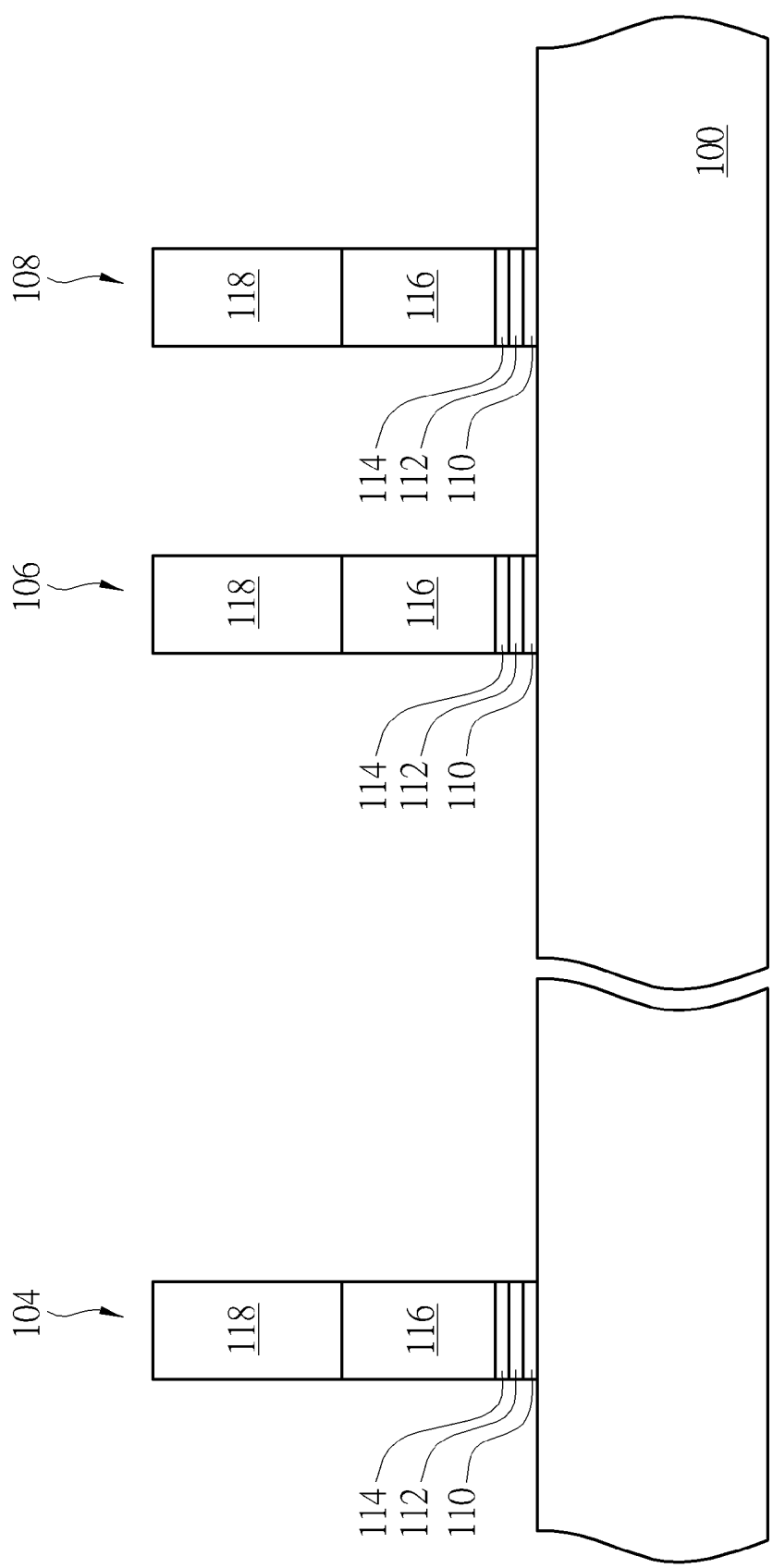
FIG. 2 through FIG. 12 illustrate a method of fabricating a semiconductor device according to a preferred exemplary embodiment of the present invention

The present invention provides a method of fabricating a semiconductor device. Please refer to FIG. 2 through FIG. 12, which are schematic diagrams illustrating a method of fabricating a semiconductor device according to a preferred exemplary embodiment of the present invention. As shown in FIG. 2, three gate stack layers 104/106/108 are formed on a substrate 100. The substrate 100 includes a semiconductor substrate composed of Si, AsGa, silicon on insulator (SOI) layer, epitaxial layer, SiGe layer or other semiconductor materials. Each of the gate stack layers 104/106/108 includes at least a gate layer and at least a dielectric layer. In this exemplary embodiment, each of the gate stack layers 104/106/108 includes a first dielectric layer 110, a first gate layer 112, a second dielectric layer 114, a second gate layer 116 and a cap layer 118 disposed sequentially on the semiconductor substrate 100. The gate stack layers 104/106/108 have substantially the same height and the same width, but are not limited thereto.

The method of forming the gate stack layers 104/106/108 includes the following steps. At first, a stack layer (not shown) including a first dielectric material layer, a first gate material layer, a second dielectric material layer, a second gate material layer and a cap material layer are disposed orderly on the substrate 100. The first dielectric material layer and the second dielectric material layer may respectively include a single-layered structure or a multi-layered structure made of insulating materials such as silicon oxide, silicon oxynitride, or other high-k gate dielectric layers with a dielectric constant larger than 4. The first gate material layer and the second gate material layer may be made of conductive materials such as polysilicon, metal silicide or metal layer with a specific work function, and the first gate material layer may also include material such as silicon nitride in order to trap charges. The cap material layer may include a single-layered structure or a multi-layered structure made of insulating materials such as silicon oxide, silicon nitride, other suitable dielectric materials or a combination thereof. In this exemplary embodiment, the first dielectric material layer and the second dielectric material layer are made of silicon oxide formed through a thermal oxidation process or a deposition process such as a chemical vapor deposition (CVD) process or an atomic layer deposition (ALD) process; the first gate material layer is made of silicon nitride through a deposition process; the second gate material layer is made of polysilicon formed through a low pressure chemical vapor deposition (LPCVD) process; and the cap material layer includes a multi-layered structure made of silicon oxide and silicon nitride via a chemical vapor deposition (CVD) process, but these processes are not limited thereto.

Subsequently, a patterned photoresist layer (not shown) is formed on the gate stack layers 104/106/108, and an etching process is performed to remove a part of the stack layer to form the gate stack layers 104/106/108. The etching process may include the following steps. The patterned photoresist layer is used as a mask, and an anisotropic dry etching process is performed to remove a part of the first/second dielectric material layers, a part of the first/second gate material layers and the cap material layer below the patterned photoresist layer to form the first dielectric layer 110, the first gate layer 112, the second dielectric layer 114, the second gate layer 116 and the cap layer 118 disposed sequentially on the substrate 100. In this exemplary embodiment, the first dielectric layer 110 may serve as a dielectric layer between the gate and the substrate 100, the first gate layer 112 may serve as a charge trapped layer, the second dielectric layer 114 may serve as a dielectric layer between gates, and the second gate layer 116 may serve as a control gate. Then, the patterned photoresist layer is removed.

Figure 3:
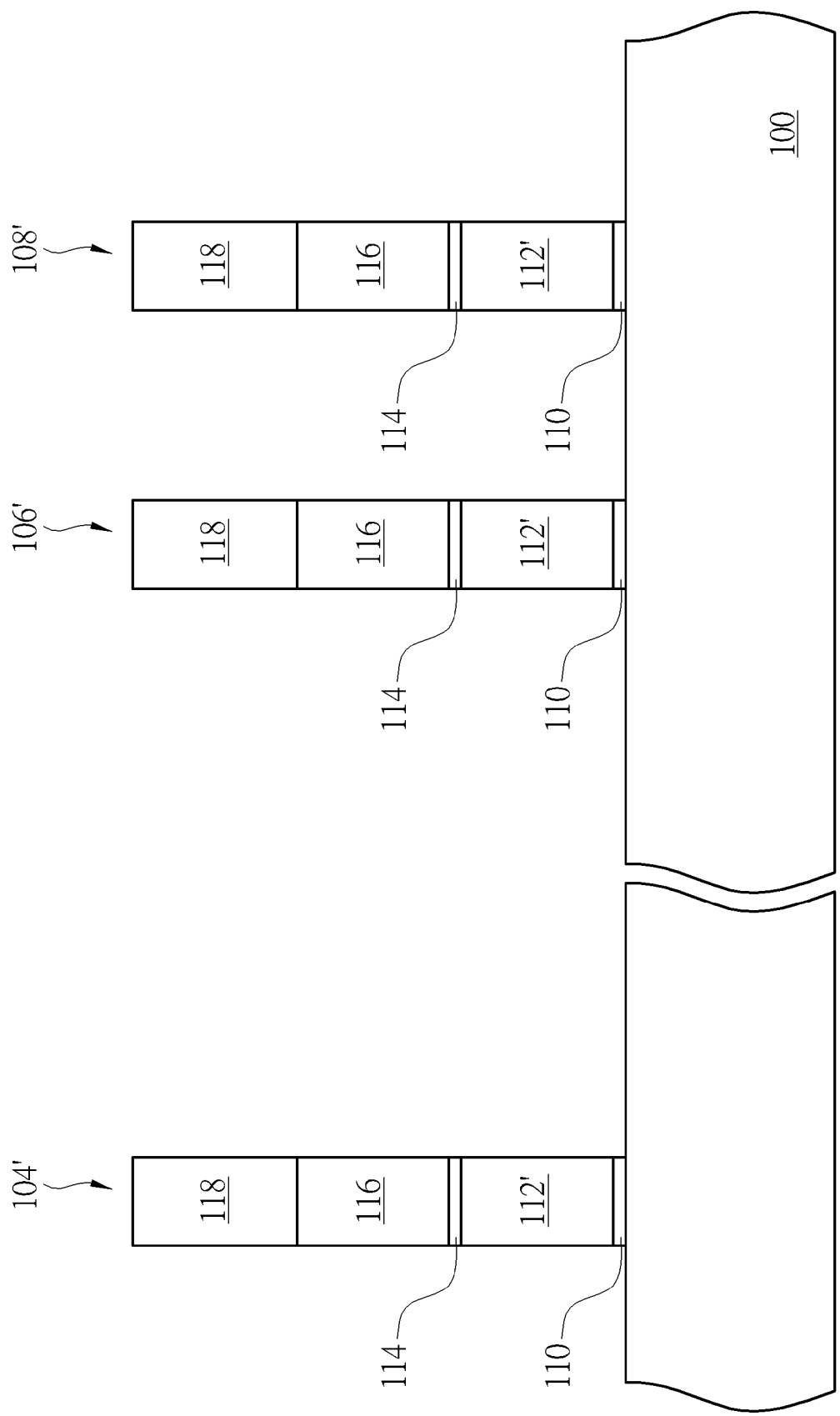

In another exemplary embodiment, as shown in FIG. 3, in the gate stack layers 104'/106'/108', the first gate material layer is made of polysilicon, and the first dielectric layer 106 may serve as a tunneling oxide, the first gate layer 112' may serve as a floating gate, the second dielectric layer 114 may serve as a dielectric layer between gates, and the second gate layer 116 may serve as a control gate. The embodiments illustrated above are only given for examples. The gate stack layer in the present invention can have a variety of embodiments, which are not described herein for the sake of brevity. The following description is based on the gate stack layers 104/106/108 of the embodiment shown in FIG. 2.

Figure 4:
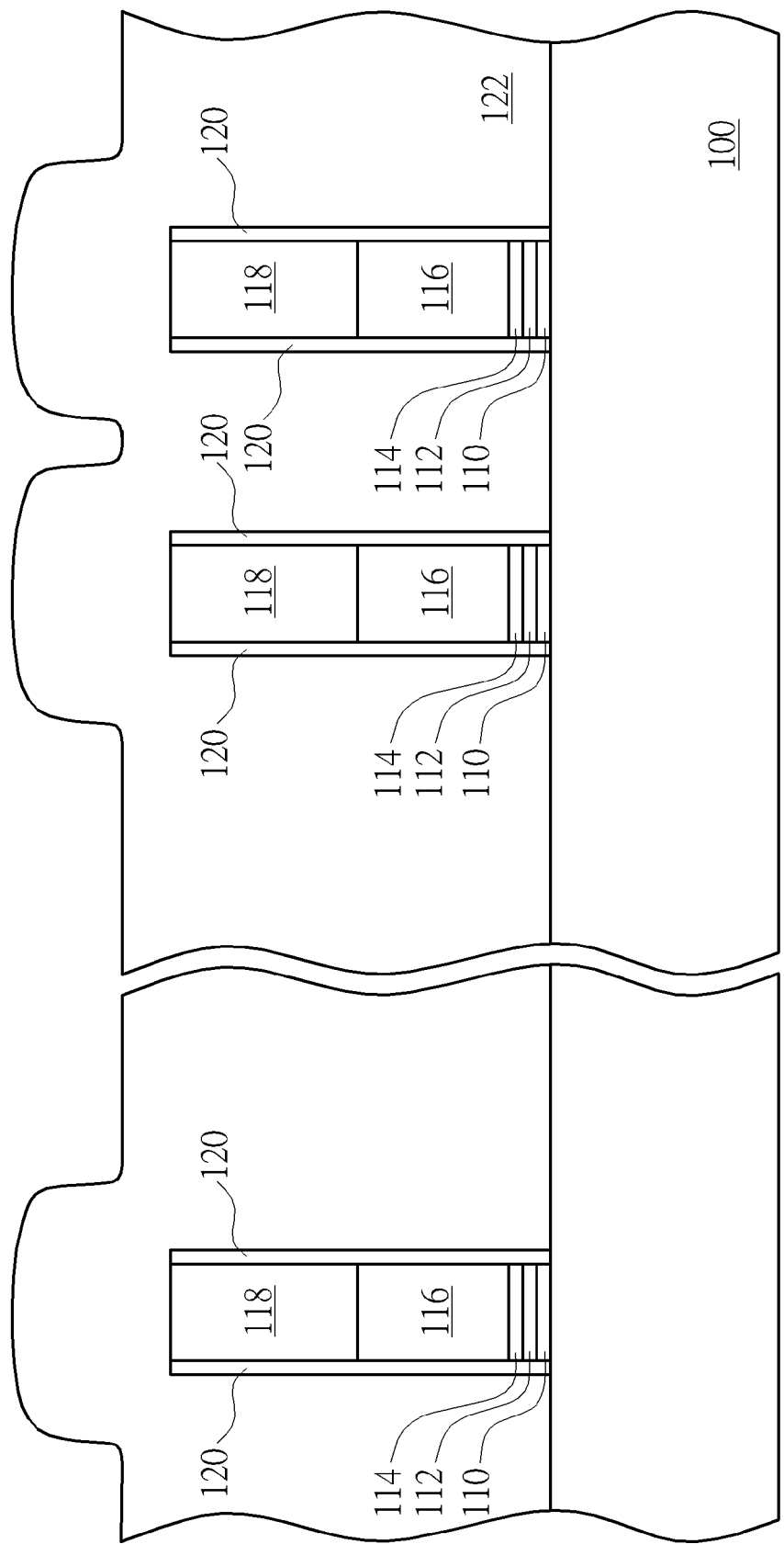

As shown in FIG. 4, a dielectric layer (not shown) is conformally formed on the substrate 100. The dielectric layer may include a single-layered structure or a multi-layered structure made of insulating materials such as silicon oxide, silicon nitride, silicon oxynitride, or a combination thereof. In this exemplary embodiment, the dielectric layer includes a multi-layered structure made of silicon oxide and silicon nitride via a chemical vapor deposition (CVD) process. Subsequently, an etching process is performed to partially remove the dielectric layer to form the sidewall spacers 120 such as oxide-nitride (ON) spacers totally covering the sidewalls of each of the gate stack layers 104/106/108. Then, a conductive material layer 122 made of conductive material such as polysilicon, metal silicide or metal layer with specific work function is formed to cover the gate stack layers 104/106/108. In this exemplary embodiment, the conductive material layer 122 is made of polysilicon via a chemical vapor deposition (CVD) process, which can be used to form a select gate in the following processes, but is not limited thereto. In other exemplary embodiments, the conductive material layer may be replaced by an insulating material layer which is applied in the other kinds of semiconductor processes.

Figure 5:
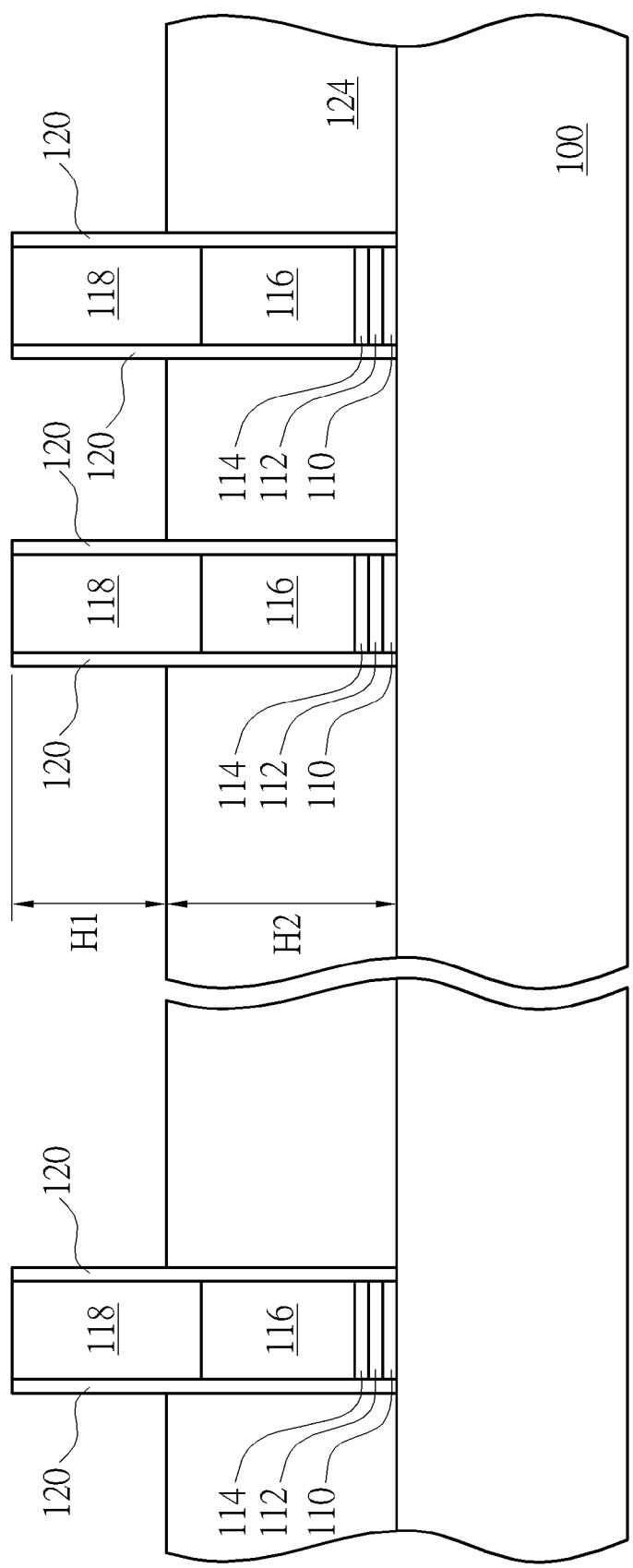

As shown in FIG. 5, a planarization process such as a chemical mechanical polishing (CMP) process is performed to expose the gate stack layers 104/106/108 and form a planarized conductive material layer (not shown), in which a top of the planarized conductive material layer is aligned with a top of the gate stack layer 104/106/108. Afterwards, an etching back process is further performed to remove a part of the planarized conductive material layer to form the conductive layer 124, wherein a top of the conductive layer 124 is substantially lower than the top of the gate stack layer 104/106/108. The etching back process could be a dry etching process or a wet etching process, and the etching process conditions, such as the selectivity of the etchant or the etching period, could be modified to control a step height H1 between the top of the conductive layer 124 and the top of the gate stack layer 104/106/108 according to process demands. A thickness H2 of the conductive layer 124 may correspond to a predetermined height of the later formed select gate. In this exemplary embodiment, the step height H1 could be between 800 and 1000 Angstroms (Å), the thickness H2 of the conductive layer 124 is around 1100 Angstroms (Å), and the top of the conductive layer 124 is higher than a top of the second gate layer 116 (i.e. an interface between the second gate layer 116 and the cap layer 118), but is not limited thereto. Accordingly, the gate stack layers 104/106/108 protruding from the conductive layer 124 on the substrate 100 are provided.

Figure 6:
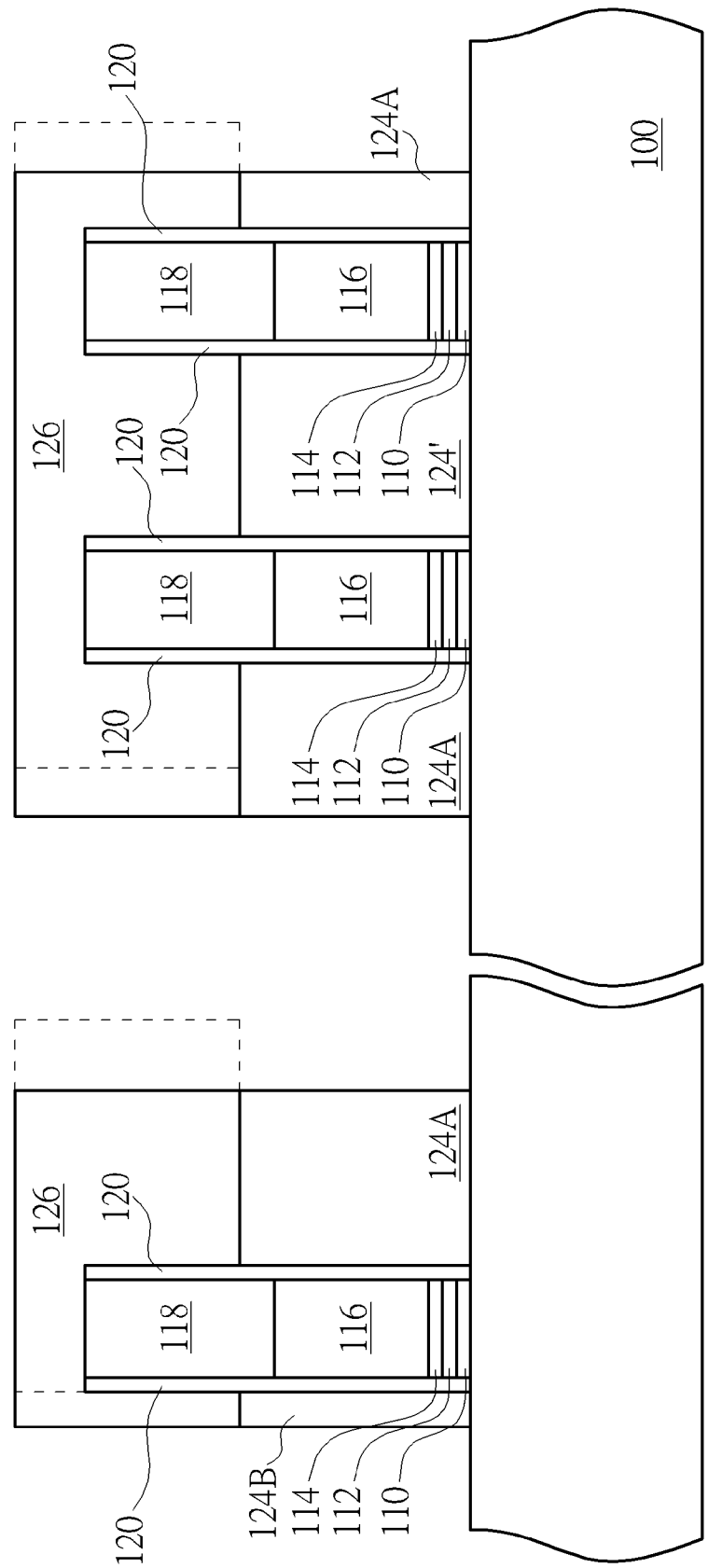

As shown in FIG. 6, in one exemplary embodiment, a patterned photoresist layer 126 is formed on the conductive layer 124, and an etching process is performed to remove the conductive layer 124 not covered by the patterned photoresist layer 126 to form a remaining conductive layer 124'. In this way the remaining conductive layer 124' may include the select gates 124A having planar top surfaces. As the patterned photoresist layer 126 shifts from its predetermined position (marked by dashed lines), however, the unwanted conductive layer residue 124B may be found at a side of the gate stack layer 104, and the formed select gates 124B may have different widths, which worsens the consistency of the select gates.

Figure 7:
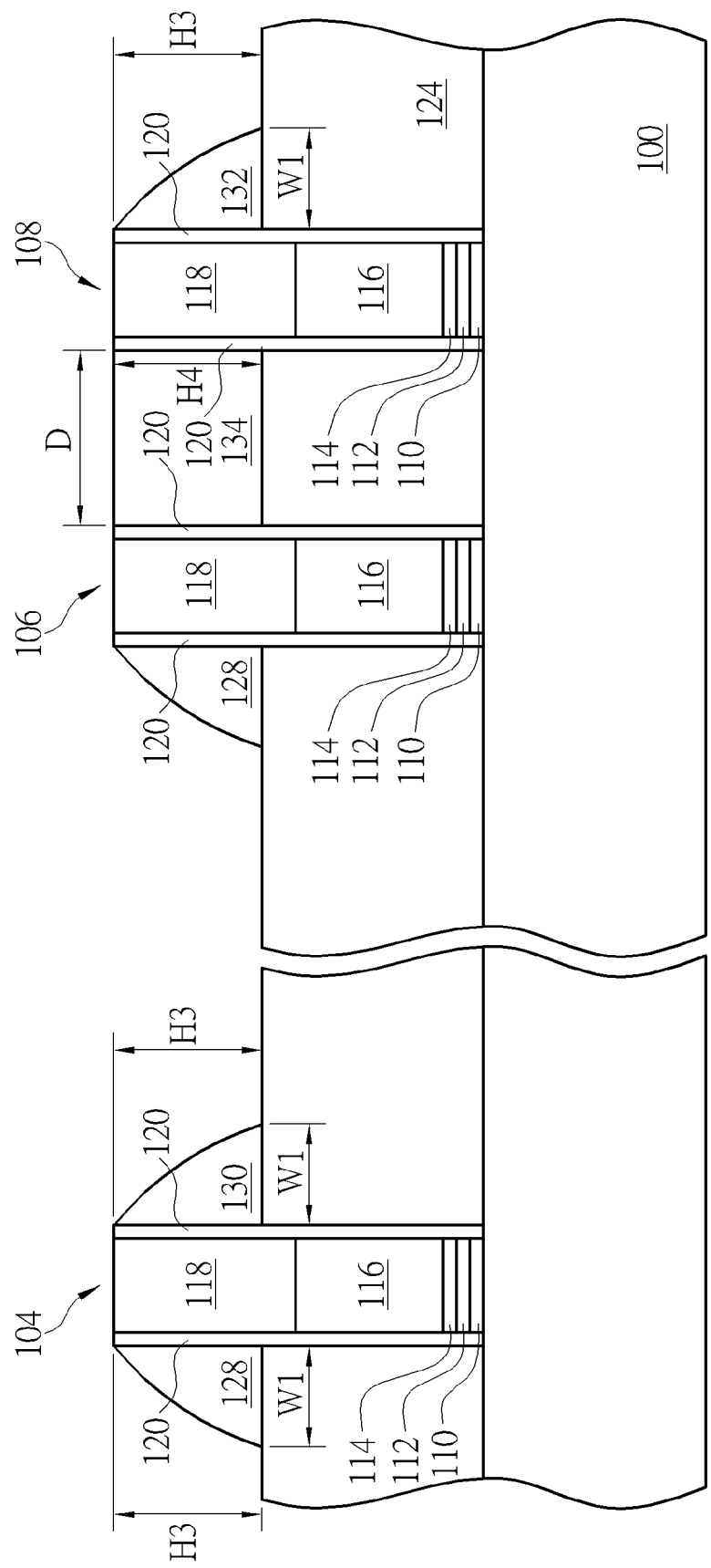

In order to avoid the unwanted conductive layer residue and improve the consistency of the formed select gates, the present invention provides at least a self-aligned spacer to replace the patterned photoresist layer 126 for defining the locations of the formed select gates. In a preferred exemplary embodiment, as shown in FIG. 7, a first spacer 128, a second spacer 130, a third spacer 132 and a protective layer 134 are respectively formed on the conductive layer 124 at a side of the gate stack layers 104/106/108. The method of simultaneously forming the first spacer 128, the second spacer 130, the third spacer 132 and the protective layer 134 includes the following steps. A sacrificial material layer (not shown) such as a dielectric layer is formed to cover the gate stack layers 104/106/108 and the conductive layer 124, wherein the sacrificial material layer including a single-layered structure or a multi-layered structure could be made of conductive materials such as metal or dielectric materials such as silicon oxide, silicon nitride, amorphous carbon or a combination thereof. As the sacrificial material layer includes a multi-layered structure, it is preferable that a layer contacting the formed structures such as the gate stack layers 104/106/108 and the conductive layer 124 is denser than the other layers disposed on the denser layer. For example, the sacrificial material layer may include a silicon nitride layer disposed on a silicon oxide layer (a denser layer). In this exemplary embodiment, the sacrificial material layer is a dielectric layer including a multi-layered structure made of an amorphous carbon layer disposed on a silicon oxide layer, and the silicon oxide layer is denser than the amorphous carbon layer to provide a better protection effect for the structures formed underneath.

Subsequently, an etching process is performed to remove a part of the sacrificial material layer such as the dielectric layer in this exemplary embodiment to expose the gate stack layers 104/106/108. The remaining sacrificial material layer includes the self-aligned first spacer 128 at a side of the gate stack layer 104/106, the self-aligned second spacer 130 at another side of the gate stack layer 104, the self-aligned third spacer 132 at a side of the gate stack layer 108, and the protective layer 134 formed between the gate stack layer 106 and the gate stack layer 108 (i.e. the protective layer 134 is between an inner side of the gate stack layer 106 and an inner side of the gate stack layer 108). In other words, the first spacer 128 and the second spacer 130 are formed at opposite sides of the gate stack layer 104, and the other first spacer 128 and the third spacer 132 are formed at opposite lateral sides of the gate stack layers 106/108 (i.e. the first spacer 128 and the third spacer 132 are respectively at an outer side of the gate stack layer 106 and at an outer side of the gate stack layer 108). The first spacer 128 and the second spacer 130 may jointly surround the protruded gate stack layer 104 (i.e. a part of the gate stack layer 104 protruding from the conductive layer 124), and the other first spacer 128, the third spacer 132 and the protective layer 134 may jointly surround the protruded gate stack layer 106 and the protruded gate stack layer 108 (i.e. a part of the gate stack layers 106/108 protruding from the conductive layer 124). In this exemplary embodiment, the first spacer 128, the second spacer 130 and the third spacer 132 have the same height H3 and the same width W1, and the arc surface of the first spacer 128 and the arc surface of the second spacer 130/the third spacer 132 have opposite protruding directions. Therefore, the second spacer 130/the third spacer 132 is a symmetric reflection of the first spacer 128. Furthermore, a height H4 of the protective layer 134 is substantially the same as the height H3 of the spacers 128/130/132, but is not limited thereto.

It is noted that the interval D between the gate stack layers 106/108 and the process conditions of the etching process used to remove a part of the sacrificial material layer can be modified to have the remaining sacrificial material layer between the gate stack layers 106/108 merged into the protective layer 134, without being separated as two spacers. In this exemplary embodiment, a thickness of the sacrificial material layer before performing the etching process is larger than double the interval D between the gate stack layers 106/108, therefore, the formed protective layer 134 entirely overlaps the conductive layer 124 between the gate stack layers 106/108. Moreover, the interval D between the gate stack layers 106/108 may cause the top shape of the conductive layer 124 to be a planar surface or a surface having a concave V-shape.

Figure 8:
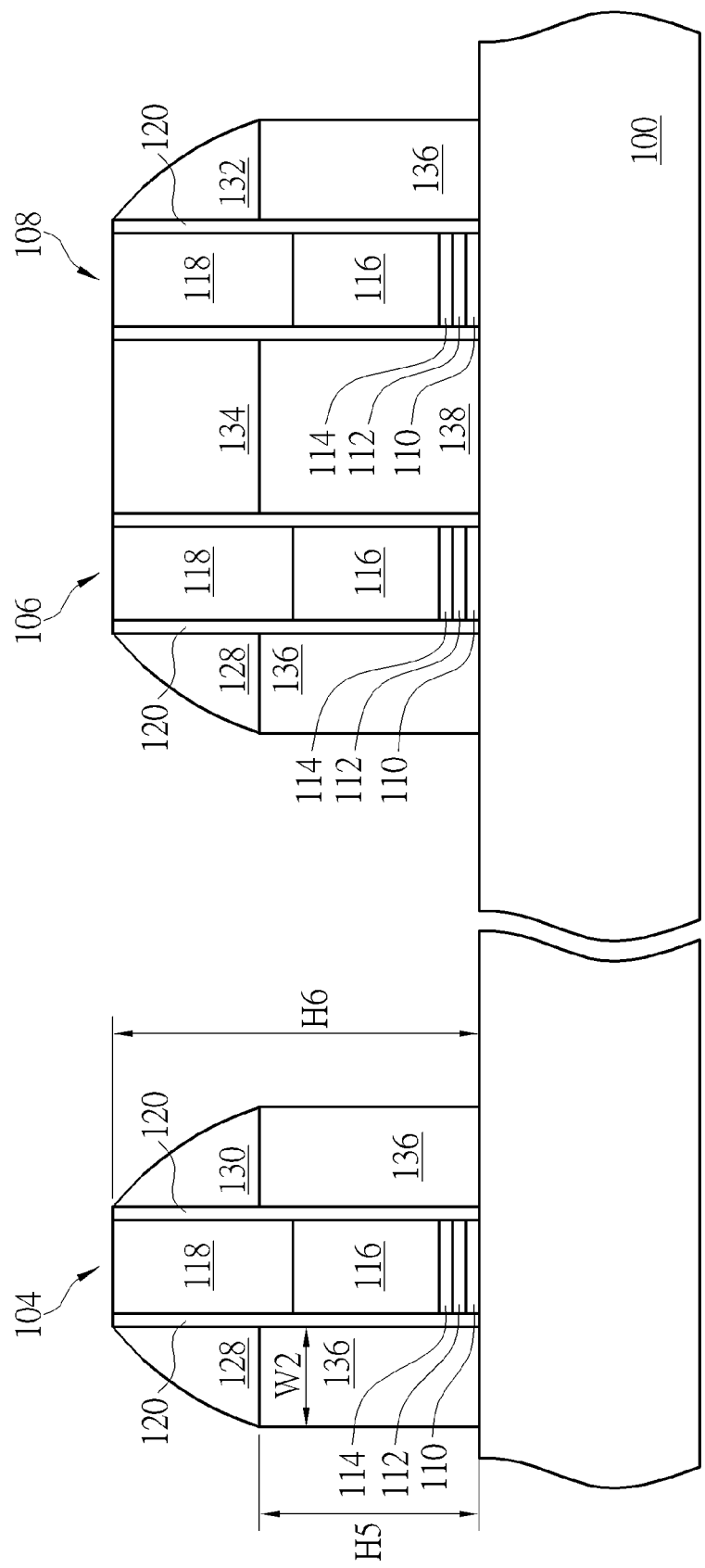

As shown in FIG. 8, an anisotropic etching process is performed, and the first spacer 128, the second spacer 130, the third spacer 132 and the protective layer 134 are jointly used as a mask to remove a part of the conductive layer 124 to form select gates 136 having planar top surfaces, and the remaining conductive layer 124, which is between the gate stack layers 106/108 and still totally covered by the protective layer 134, can serve as an erase gate 138 in the later completed semiconductor device. In this exemplary embodiment, a height H5 of the formed select gate 136 is preferably substantially equal to the thickness H2 of the conductive layer 124 and smaller than a height HE of each of the gate stack layers 104/106/108, and a width W2 of the formed select gate 136 is preferably substantially equal to the width W1 of the first spacer 128/the second spacer 130/the third spacer 132 disposed thereon.

It should be appreciated that, the dimension of the previously self-aligned spacer (i.e. the first spacer 128, the second spacer 130, the third spacer 132) relates to the predetermined dimension of the select gate; more specifically, a height of the self-aligned spacer is preferably equal to a difference between a height of the gate stack layer and a predetermined height of the select gate, i.e. the step height H1 between the top of the conductive layer 124 and the top of the gate stack layer 104/106/108, and a width of the self-aligned spacer is preferably equal to a predetermined width of the select gate.

Figure 9:
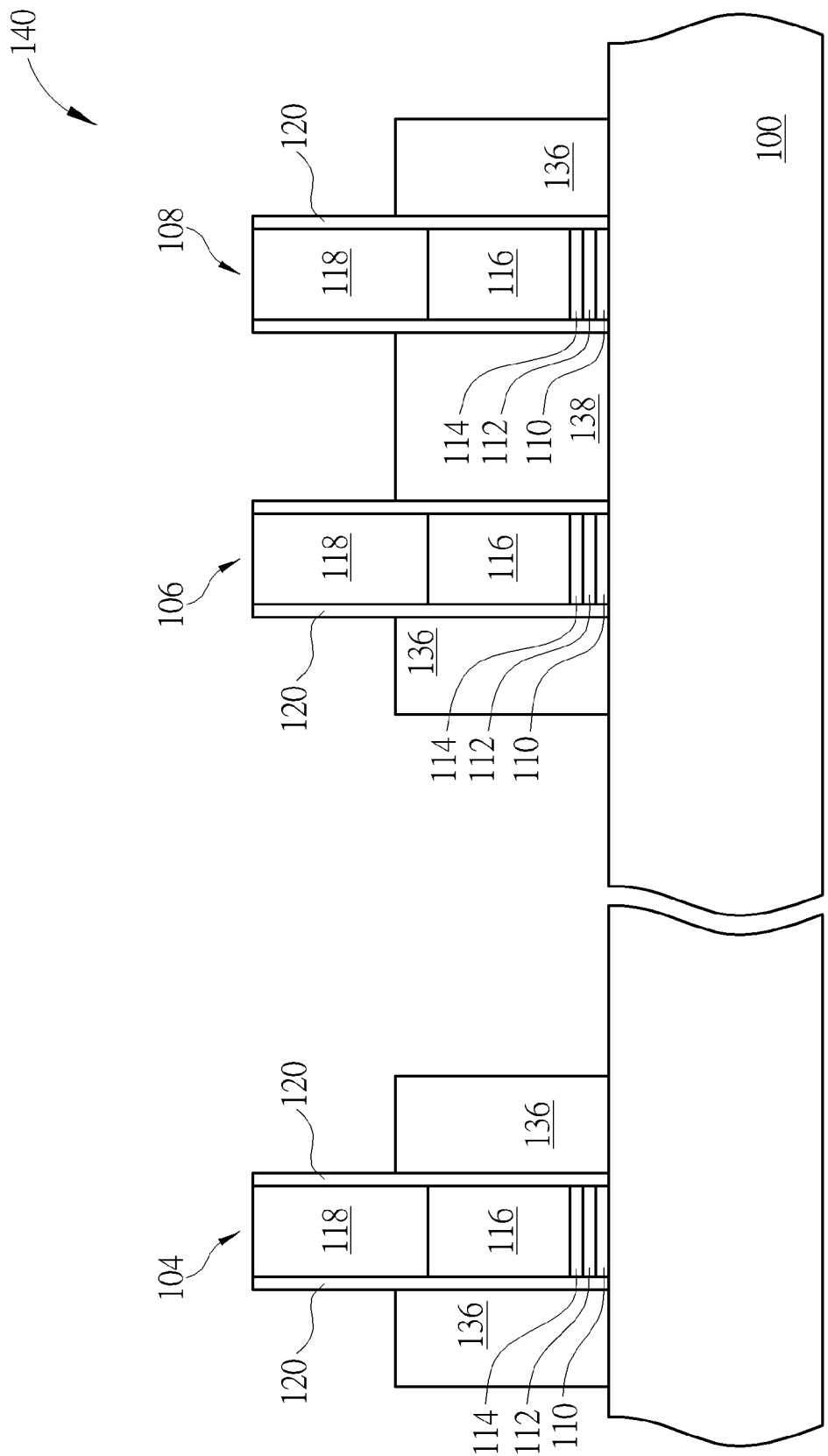

As shown in FIG. 9, the first spacer 128, the second spacer 130, the third spacer 132 and the protective layer 134 can be removed to expose the select gates 136 (at two sides of the gate stack layers 104, at the outer side of the gate stack layer 106 and at the outer side of the gate stack layer 108) and the erase gate 138 (between the inner side of the gate stack layer 106 and the inner side of the gate stack layer 108). Accordingly, the semiconductor device 140 including the select gate 136 having planar top surface is completed. Moreover, one of the select gates 136 at two sides of the gate stack layers 104 can serve as an erase gate or be optionally removed.

Figure 10:
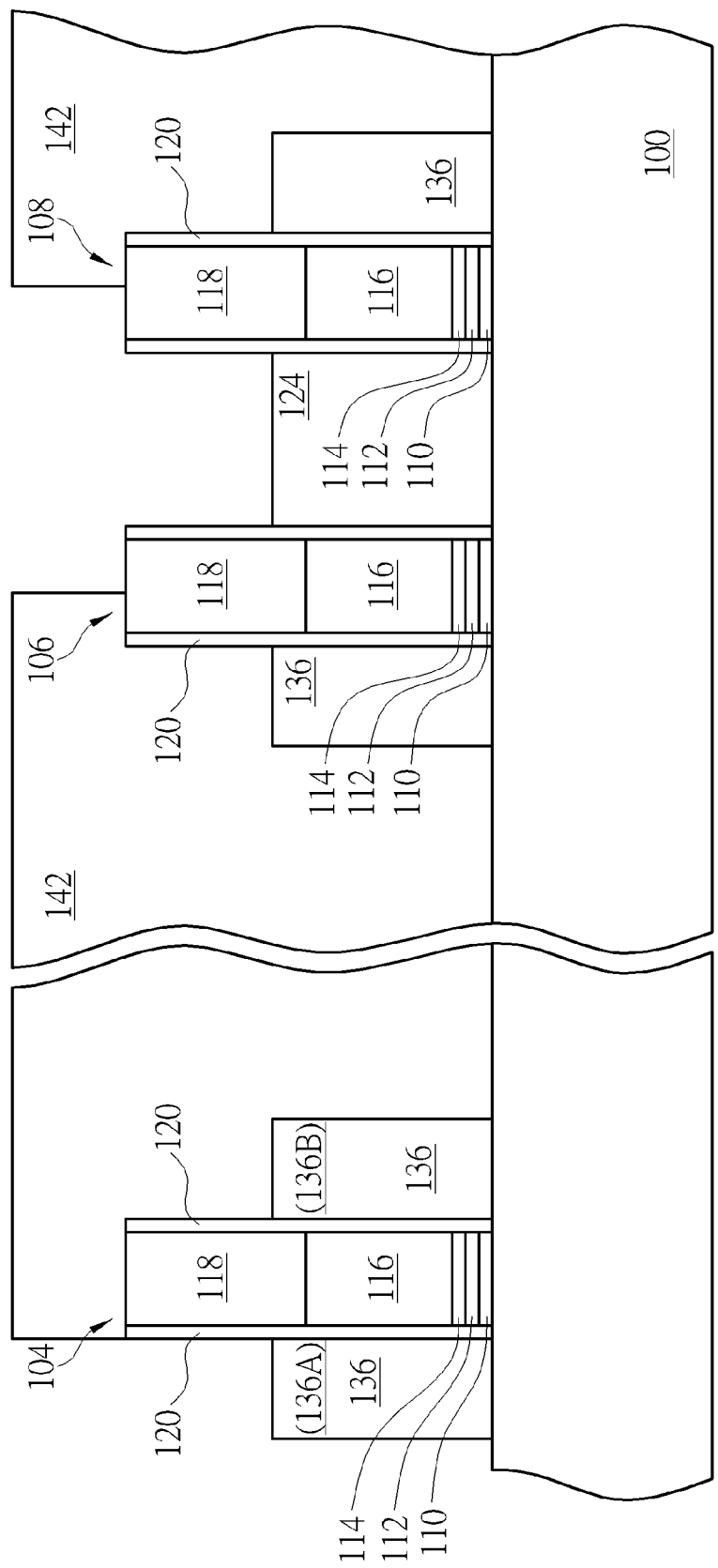
Figure 11:
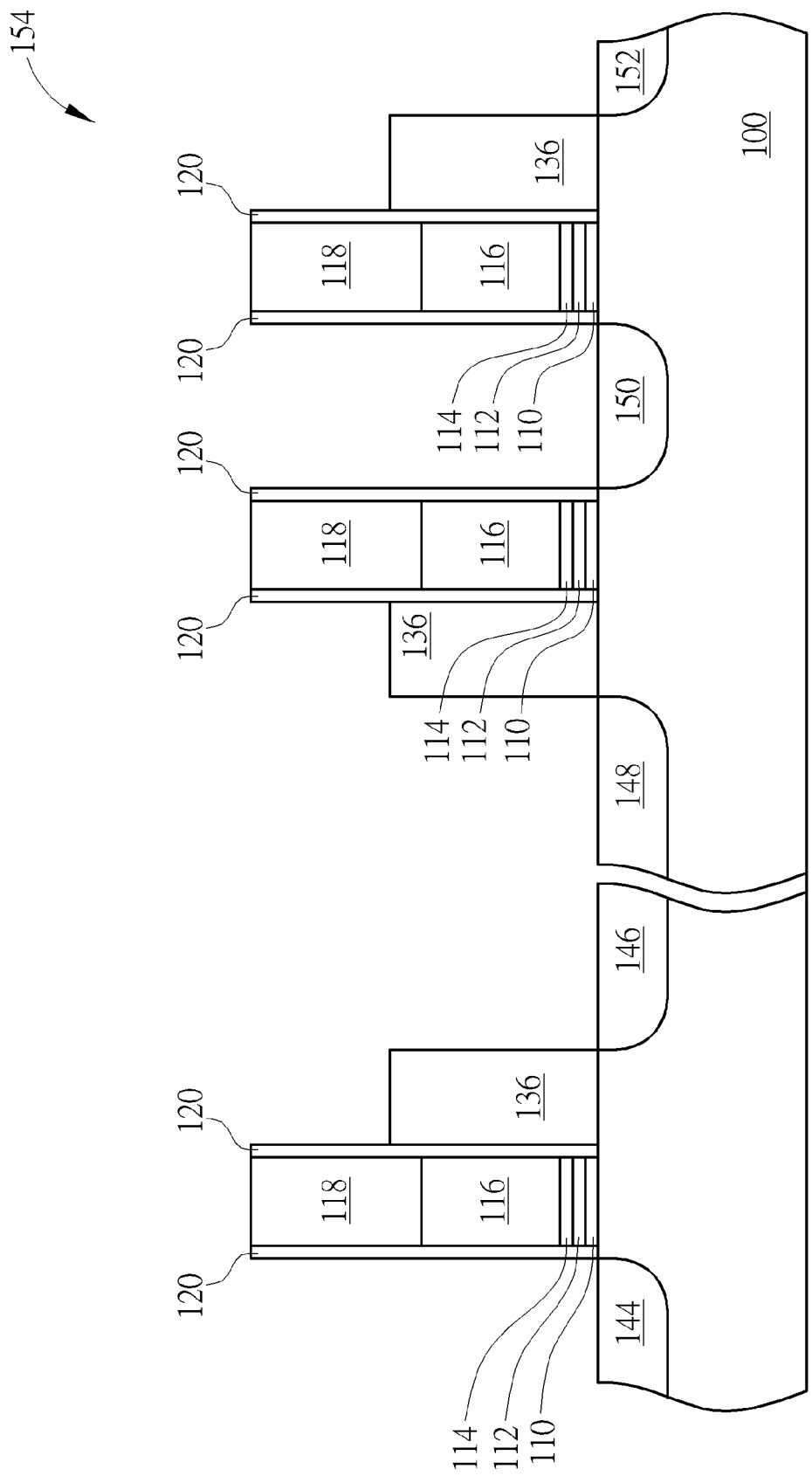

As shown in FIG. 10, in another exemplary embodiment, after removing the first spacer 128, the second spacer 130, the third spacer 132 and the protective layer 134, a patterned hard mask 142 such as a patterned photoresist layer can be further formed to cover the select gates 136 at a side of the gate stack layers 106/108, one of the select gates 136 at two sides of the gate stack layers 104 (i.e. the select gate 136B in this exemplary embodiment) and the gate stack layer 104, and partially cover the gate stack layers 106/108 to expose the remaining conductive layer 124 between the gate stack layers 106/108 and another one of the select gates 136 at two sides of the gate stack layers 104 (i.e. the select gate 136A in this exemplary embodiment). As shown in FIG. 11, an etching process can be further performed to remove the remaining conductive layer 124 between the gate stack layers 106/108 and the select gate 136A, and an etchant used in this etching process may have an etching selectivity to the remaining conductive layer 124 and the select gate 136A (i.e. a removing rate of the remaining conductive layer 124 and the select gate 136A such as polysilicon is higher than a removing rate of the exposed cap layer 118 and sidewall spacers 120 such as silicon nitride). Afterward, the patterned hard mask 142 is removed.

Moreover, an ion implantation process can be performed, and the gate stack layers 104/106/108 are used as a mask, therefore, the source/drain regions 144/146/148/150/152 are respectively formed in the substrate 100 at two sides of each of the gate stack layers 104/106/108. In this exemplary embodiment, the source/drain region 150 can serve as the common source region of the gate stack layers 106/108, which may reduce the occupied area of the formed semiconductor device, and increase the integration rate of semiconductor devices. Accordingly, the semiconductor device 154 including the select gate 136 having a planar top surface is completed.

Figure 12:
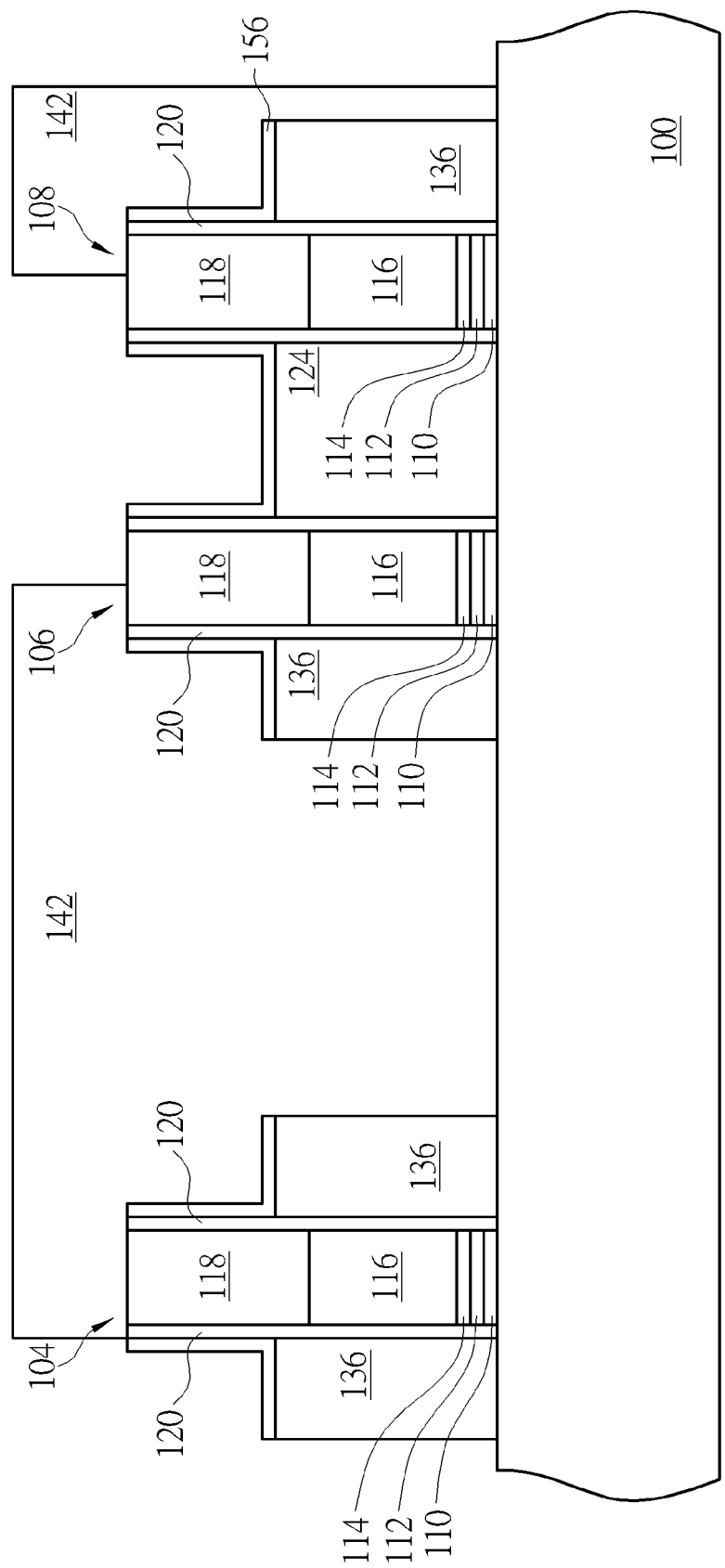

Furthermore, as shown in FIG. 12, in another exemplary embodiment, the first spacer 128, the second spacer 130, the third spacer 132 and the protective layer 134 can be partially removed instead of being totally removed to form a remaining material layer 156. In this exemplary embodiment, as the sacrificial material layer used to form the spacers 128/130/132 and the protective layer 134 is a dielectric layer including a multi-layered structure made of an amorphous carbon layer disposed on a silicon oxide layer, the amorphous carbon layer can be removed, and the denser silicon oxide layer is left to protect the structures underneath. The patterned hard mask 142 is further formed on the remaining material layer 156. As the remaining material layer 156 is disposed between the formed select gates 136 and the patterned hard mask 142, the damage caused by the later process of removing the patterned hard mask 142 can be avoided and the structural completeness of the select gates 136 can be improved. Subsequently, the remaining material layer 156 and the remaining conductive layer 124 exposed by the patterned hard mask 142 can be removed to partially expose the gate stack layers 106/108. Finally, the patterned hard mask 142 and the left remaining material layer 156 are removed to form the semiconductor device 154 as illustrated in FIG. 11.

In conclusion, the present invention provides at least a spacer formed on a conductive layer at a side of at least a gate stack layer, where the spacer can further serve as a mask to remove a part of the conductive layer to form a select gate having a planar top surface, in which a bottom width of the spacer corresponds to a predetermined top width of the formed select gate. The spacer can be self-aligned and directly used as a mask to define the location of the select gate. As a consequence, some extra photolithography processes can be omitted to simplify the manufacturing process, and the mask shift issue can be avoided which improves the consistency of the formed select gates.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing at least a first gate stack layer protruding from a conductive layer on a substrate, wherein the first gate stack layer comprises a floating gate and a control gate on the floating gate;
   forming a first spacer on the conductive layer at a side of the first gate stack layer; and
   using the first spacer as a mask to remove a part of the conductive layer to form a select gate having a planar top surface.

2. The method of fabricating a semiconductor device according to claim 1, further comprising:
   forming a second spacer on the conductive layer at another side of the first gate stack layer; and
   using the second spacer as a mask to remove a part of the conductive layer.

3. The method of fabricating a semiconductor device according to claim 2, wherein the second spacer is a symmetric reflection of the first spacer.

4. The method of fabricating a semiconductor device according to claim 2, wherein a method of simultaneously forming the first spacer and the second spacer, comprises:
   forming a sacrificial material layer covering the first gate stack layer and the conductive layer; and
   removing a part of the sacrificial material layer to expose the first gate stack layer.

5. The method of fabricating a semiconductor device according to claim 1, further comprising forming a protective layer on the conductive layer at another side of the first gate stack layer.

6. The method of fabricating a semiconductor device according to claim 5, wherein a height of the protective layer is substantially the same as a height of the first spacer.

7. The method of fabricating a semiconductor device according to claim 5, further comprising:
   providing at least a second gate stack layer protruding from the conductive layer on the substrate before forming the first spacer and the protective layer; and
   forming the protective layer on the conductive layer at a side of the second gate stack layer and a third spacer on the conductive layer at another side of the second gate stack layer.

8. The method of fabricating a semiconductor device according to claim 7, wherein the third spacer is a symmetric reflection of the first spacer.

9. The method of fabricating a semiconductor device according to claim 7, wherein the protective layer totally covers the conductive layer between the first gate stack layer and the second gate stack layer.

10. The method of fabricating a semiconductor device according to claim 7, wherein a method of simultaneously forming the first spacer, the third spacer and the protective layer, comprises:
    forming a sacrificial material layer covering the first gate stack layer, the second gate stack layer and the conductive layer; and
    removing a part of the sacrificial material layer to expose the first gate stack layer and the second gate stack layer.

11. The method of fabricating a semiconductor device according to claim 1, further comprising removing the first spacer to expose the select gate.

12. A method of fabricating a semiconductor device, comprising:
    providing at least a first gate stack layer and at least a second gate stack layer protruding from a conductive layer on a substrate;
    forming two spacers and a protective layer on the conductive layer, wherein the two spacers and the protective layer jointly surround the protruded first gate stack layer and the protruded second gate stack layer;
    using the two spacers and the protective layer as a mask to remove a part of the conductive layer; and
    removing the two spacers and the protective layer.

13. The method of fabricating a semiconductor device according to claim 12, wherein a method of forming the two spacers and the protective layer on the conductive layer comprises:
    forming a sacrificial material layer covering the first gate stack layer, the second gate stack layer and the conductive layer; and
    removing a part of the sacrificial material layer to expose the first gate stack layer and the second gate stack layer.

14. The method of fabricating a semiconductor device according to claim 13, wherein the sacrificial material layer comprises a single-layered structure or a multi-layered structure.

15. The method of fabricating a semiconductor device according to claim 13, wherein a material of the sacrificial material layer comprises silicon oxide, silicon nitride, amorphous carbon or a combination thereof.

16. The method of fabricating a semiconductor device according to claim 12, wherein the two spacers are respectively at an outer side of the first gate stack layer and at an outer side of the second gate stack layer.

17. The method of fabricating a semiconductor device according to claim 12, wherein the protective layer is between an inner side of the first gate stack layer and an inner side of the second gate stack layer.

18. The method of fabricating a semiconductor device according to claim 12, further comprising removing the conductive layer between an inner side of the first gate stack layer and an inner side of the second gate stack layer after removing the two spacers and the protective layer.

19. The method of fabricating a semiconductor device according to claim 12, wherein removing the two spacers and the protective layer comprises partially removing the two spacers and the protective layer to form a remaining material layer.

20. The method of fabricating a semiconductor device according to claim 12, wherein the conductive layer comprises a polysilicon layer.

* * * * *